US007932154B2

(12) United States Patent
Kim et al.

(10) Patent No.: US 7,932,154 B2
(45) Date of Patent: Apr. 26, 2011

(54) METHOD OF FABRICATING NON-VOLATILE FLASH MEMORY DEVICE HAVING AT LEAST TWO DIFFERENT CHANNEL CONCENTRATIONS

(75) Inventors: Sang-Su Kim, Suwon-si (KR); Sung-Taeg Kang, Seoul (KR); In-Wook Cho, Yongin-si (KR); Jeong-Hwan Yang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 661 days.

(21) Appl. No.: 12/007,097

(22) Filed: Jan. 7, 2008

(65) Prior Publication Data

US 2008/0108197 A1   May 8, 2008

Related U.S. Application Data

(62) Division of application No. 11/097,281, filed on Apr. 4, 2005, now Pat. No. 7,320,920.

(30) Foreign Application Priority Data

Jun. 17, 2004 (KR) .................................. 2004-45142

(51) Int. Cl.
   *H01L 21/334* (2006.01)
(52) U.S. Cl. .................. 438/287; 257/E21.423
(58) Field of Classification Search .................. 438/287; 257/314–316
   See application file for complete search history.

(56) References Cited

U.S. PATENT DOCUMENTS

| 4,101,921 | A | 7/1978 | Shimada et al. |
| 5,241,499 | A | 8/1993 | Camerlenghi |
| 5,812,449 | A | 9/1998 | Song |
| 6,388,293 | B1 | 5/2002 | Ogura et al. |
| 6,815,764 | B2 | 11/2004 | Bae et al. |
| 6,867,453 | B2 * | 3/2005 | Shin et al. ..................... 257/314 |

(Continued)

FOREIGN PATENT DOCUMENTS

JP   2001-168219   6/2001

(Continued)

OTHER PUBLICATIONS

Chen, Chun, et al., "Analysis of Enhanced Hot-Carrier Effects in Scaled Flash Memory Devices", IEEE Transactions on Electron Devices, vol. 45, No. 7, pp. 1524-1530, (Jul. 1998).

*Primary Examiner* — David Vu
*Assistant Examiner* — David Ziskind
(74) *Attorney, Agent, or Firm* — Lee & Morse P.C.

(57) ABSTRACT

In a non-volatile flash memory device, and a method of fabricating the same, the device includes a semiconductor substrate, a source region and a drain region disposed in the semiconductor substrate to be spaced apart from each other, a tunneling layer pattern, a charge trap layer pattern and a shielding layer pattern, which are sequentially stacked on the semiconductor substrate between the source region and the drain region, adjacent to the source region, a first channel region disposed in the semiconductor substrate below the tunneling layer pattern, a gate insulating layer disposed on the semiconductor substrate between the drain region and the first channel region, a second channel region disposed in the semiconductor substrate below the gate insulating layer, a concentration of the second channel region being different from that of the first channel region, and a gate electrode covering the shielding layer pattern and the gate insulating layer.

9 Claims, 14 Drawing Sheets

U.S. PATENT DOCUMENTS

| | | |
|---|---|---|
| 6,958,272 B2 | 10/2005 | Lingunis et al. |
| 7,042,045 B2 | 5/2006 | Kang et al. |
| 7,045,848 B2 | 5/2006 | Shukuri |
| 2002/0074590 A1 | 6/2002 | Jong et al. |

FOREIGN PATENT DOCUMENTS

| | | |
|---|---|---|
| KR | 10-0142602 B1 | 4/1998 |
| KR | 10-0187656 B1 | 1/1999 |
| KR | 2000-0027286 A | 5/2000 |

\* cited by examiner

METHOD OF FABRICATING NON-VOLATILE FLASH MEMORY DEVICE HAVING AT LEAST TWO DIFFERENT CHANNEL CONCENTRATIONS

CROSS REFERENCE TO RELATED APPLICATION

This is a divisional application based on application Ser. No. 11/097,281, filed Apr. 4, 2005 now U.S. Pat. No. 7,320,920, the entire contents of which is hereby incorporated by reference.

BACKGROUND OF THE INVENTION

1. Field of the Invention

The present invention relates to a semiconductor memory device and method of fabricating the same. More particularly, the present invention relates to a non-volatile flash memory device having at least two different channel concentrations and a method of fabricating the same.

2. Description of Related Art

A feature of non-volatile memory devices is that previous data are maintained even when power is not supplied, unlike volatile memory devices. Recently, non-volatile memories such as a ferroelectric random access memory (FRAM), an erasable and programmable read only memory (EPROM), and electrically erasable and programmable read only memory (EEPROM) have been publicized. EPROM and EEPROM store charges on a floating gate store memorize data according to a variation of a threshold voltage depending on whether or not the charges exist. The EEPROM, which is a type of flash memory, erases data in the entire memory cell array or divides the memory cell array into blocks and erases the data in blocks. Non-volatile memory devices such as flash memories are widely used in file systems, memory cards, portable devices, and other applications.

A flash memory cell is divided into two types: a floating gate type and a floating trap type. A polysilicon-oxide-nitride-oxide-silicon (SONOS) structure is well known as a floating trap type device.

A floating gate type device includes a mechanism that stores charges on a floating gate, whereas a SONOS device includes a mechanism that stores charges in traps in a silicon nitride layer. The floating gate type device has a limitation in reducing a cell size and has to use a high voltage for programming and erasing. The SONOS device, however, may satisfy a demand for low power and low voltage and achieve high integration.

FIG. 1A illustrates a cross-sectional view of a conventional non-volatile flash memory device. FIG. 1B is a graph showing a variation of threshold voltage depending on program and erase operations of the conventional non-volatile flash memory device shown in FIG. 1A.

Referring to FIG. 1A, an isolation layer 12, which defines an active region, is disposed on a semiconductor substrate 10. Source and drain regions 35, which are separated by a channel region 17, are disposed in the active region. The channel region 17 includes a first region L1 and a second region L2. A tunneling layer 20, a charge trap layer 22, and a shielding layer 30a are disposed on the first region L1. A gate insulating layer 30b is disposed on the second region L2. The shielding layer 30a and the gate insulating layer 30b are simultaneously formed of the same material layer and are connected. A gate electrode 32 covers both the shielding layer 30a and the gate insulating layer 30b.

Referring to FIG. 1B, an x-axis denotes a gate length $L_{gate}$ of the conventional non-volatile flash memory device of FIG. 1A, and a y-axis denotes a threshold voltage $V_{th}$. In order to program the non-volatile flash memory device of FIG. 1A, electrons pass through the tunneling layer 20 by a channel-hot electron injection (CHEI) mechanism or a Fowler-Nordheim (FN) tunneling mechanism and are trapped in the charge trap layer 22. A threshold voltage $V_{th}$ in the first region L1 increases due to the trapped charges. The non-volatile flash memory device varies in threshold voltage according to an amount of trapped electrons and has an "on" level or an "off" level according to a variation of the threshold voltage.

During an erase operation, the trapped electrons are detrapped by a hot hole injection mechanism. Thus, a threshold voltage in the first region L1 decreases. However, the second region L2 has a fixed threshold voltage due to the gate insulating layer 30b. Thus, a sensing margin during program and erase operations is determined by a variation SM1 of the threshold voltage, as shown in FIG. 1B. When a threshold voltage in the second region L2 is reduced by $\Delta V_{th}$, the sensing margin increases, i.e., SM2. One method of reducing the threshold voltage in the second region L2 is to reduce a thickness of the gate insulating layer 30b. However, since the gate insulating layer 30b is formed at the same time as the shielding layer 30a, reducing the thickness of the shielding layer 30a deteriorates cell retention characteristics. Thus, there is a need for research into reducing the threshold voltage in the second region L2 while maintaining the thickness of the gate insulating layer 30b.

SUMMARY OF THE INVENTION

The present invention is therefore directed to a non-volatile flash memory device having at least two different channel concentrations and a method of fabricating the same, which substantially overcome one or more of the problems due to the limitations and disadvantages of the related art.

It is a feature of an embodiment of the present invention to provide a non-volatile flash memory device, and a method of fabricating the same, which reduces a threshold voltage during an erase operation while maintaining a thickness of a gate insulating layer thereof.

It is another feature of an embodiment of the present invention to provide a non-volatile flash memory device, and a method of fabricating the same, which can increase a variation of a threshold voltage depending on program and erase operations, thereby increasing a sensing margin.

At least one of the above and other features and advantages of the present invention may be realized by providing a non-volatile flash memory device including a semiconductor substrate, a source region and a drain region disposed in the semiconductor substrate to be spaced apart from each other, a tunneling layer pattern, a charge trap layer pattern and a shielding layer pattern, which are sequentially stacked on the semiconductor substrate between the source region and the drain region, adjacent to the source, region, a first channel region disposed in the semiconductor substrate below the tunneling layer pattern, a gate insulating layer disposed on the semiconductor substrate between the drain region and the first channel region, a second channel region disposed in the semiconductor substrate below the gate insulating layer, a concentration of the second channel region being different from that of the first channel region, and a gate electrode covering the shielding layer pattern and the gate insulating layer.

In this device, an impurity concentration of the second channel region may be less than that of the first channel region.

At least one of the above and other features and advantages of the present invention may be realized by providing a non-volatile flash memory device including a semiconductor substrate, a source region and a drain region disposed in the semiconductor substrate to be spaced apart from each other, tunneling layer patterns, charge trap layer patterns and shielding layer patterns, which are sequentially stacked and spaced apart from each other on the semiconductor substrate between the source region and the drain region, one of the tunneling layer patterns, charge trap layer patterns and shielding layer patterns being adjacent to the source region and one of the tunneling layer patterns, charge trap layer patterns and shielding layer patterns being adjacent to the drain region, first channel regions disposed in the semiconductor substrate below the tunneling layer patterns, a gate insulating layer disposed on the semiconductor substrate between the first channel regions, a second channel region disposed in the semiconductor substrate below the gate insulating layer, a concentration of the second channel region being different from that of the first channel regions, and a gate electrode covering the shielding layer patterns and the gate insulating layer.

In this device, an impurity concentration of the second channel region may be less than that of the first channel regions.

At least one of the above and other features and advantages of the present invention may be realized by providing a method of fabricating a non-volatile flash memory device including defining a cell active region in a semiconductor substrate, performing a first ion implantation into the cell active region to form a first channel region, sequentially stacking a tunneling layer, a charge trap layer and a passivation layer on the semiconductor substrate having the first channel region, forming a first photoresist pattern on the semiconductor substrate having the passivation layer, the first photoresist pattern exposing a portion of the passivation layer on the first channel region, performing a second ion implantation using the first photoresist pattern as a mask to form a second channel region in the semiconductor substrate, sequentially patterning the passivation layer, the charge trap layer and the tunneling layer using the first photoresist pattern as a mask, and removing the first photoresist pattern.

The method may further include defining a peripheral circuit active region adjacent to the cell active region while defining the cell active region in the semiconductor substrate. Forming the cell active region and the peripheral circuit active region may be performed at the same time. The method may further include forming a preliminary peripheral circuit channel region in the peripheral circuit active region after forming the first channel region, wherein forming the first photoresist pattern includes forming a first photoresist pattern, which exposes a portion of the passivation layer on the first channel region and the preliminary peripheral circuit channel region, and forming the second channel region includes performing the second ion implantation using the first photoresist pattern as a mask to form the peripheral circuit channel region and the second channel region in the semiconductor substrate.

At least one of the above and other features and advantages of the present invention may be realized by providing a method of fabricating a non-volatile flash memory device including defining an active region in a semiconductor substrate, performing a first ion implantation into the active region to form a first channel region, sequentially stacking a tunneling layer, a charge trap layer and a passivation layer on the semiconductor substrate having the first channel region, forming a first photoresist pattern on the semiconductor substrate having the passivation layer, the first photoresist pattern exposing a portion of the passivation layer on the first channel region, sequentially patterning the passivation layer, the charge trap layer and the tunneling layer using the first photoresist pattern as a mask, performing a second ion implantation using the first photoresist pattern as a mask to form a second channel region in the semiconductor substrate, and removing the first photoresist pattern.

In either of these methods, forming the first photoresist pattern may include forming an opening that crosses over a center of the cell active region, wherein the first channel region is divided into a pair of first sub channel regions by the second channel region.

In either of these methods, the first photoresist pattern may be formed to cover one end of the cell active region, and the first and second channel regions may be formed to be adjacent to each other in the cell active region.

Either of these methods may further include, after removing the first photoresist pattern, sequentially forming an insulating layer and a gate electrode layer on the semiconductor substrate, and sequentially patterning the gate electrode layer, the insulating layer, the passivation layer, the charge trap layer, and the tunneling layer to form a tunneling layer pattern, a charge trap layer pattern and a shielding layer pattern, respectively, which are sequentially stacked on the pair of first sub channel regions, the shielding layer pattern being composed of the insulating layer and the passivation layer, and forming a gate insulating layer on the second channel region while forming a gate electrode covering the shielding layer pattern and the gate insulating layer.

Either of these methods may further include performing a third ion implantation using the gate electrode as a mask to form a source region and a drain region in the cell active region adjacent to one of the pair of first sub channel regions, respectively.

Forming the second channel region may include forming the second channel region to have an impurity concentration less than that of the first channel region.

Performing the second ion implantation may include using an impurity conductivity type opposite to that used in the first ion implantation.

At least one of the above and other features and advantages of the present invention may be realized by providing a method of fabricating a non-volatile flash memory device including defining a cell region and a peripheral circuit region in a semiconductor substrate, forming a cell active region and a peripheral circuit active region in the cell region and the peripheral circuit region, respectively, performing a first ion implantation into the cell active region to form a first channel region, performing a second ion implantation into the peripheral circuit active region to form a peripheral circuit channel region, sequentially stacking a tunneling layer, a charge trap layer and a passivation layer on the semiconductor substrate, forming a first photoresist pattern on the semiconductor substrate having the passivation layer, the first photoresist pattern covering a portion of the passivation layer on the first channel region, sequentially patterning the passivation layer, the charge trap layer and the tunneling layer using the first photoresist pattern as a mask, removing the first photoresist pattern, forming a second photoresist pattern covering the passivation layer and the peripheral circuit region, performing a third ion implantation using the second photoresist pattern as a mask to form a second channel region in the cell active region, and removing the second photoresist pattern.

Forming the first photoresist pattern may include forming an opening that crosses over a center of the cell active region and exposes the peripheral circuit active region, wherein the first channel region is divided into a pair of first sub channel regions by the second channel region.

The first photoresist pattern may be formed to cover one end of the cell active region and expose the peripheral circuit active region, and the first and second channel regions are formed to be adjacent to each other in the cell active region.

The method may further include, after removing the second photoresist pattern, sequentially forming an insulating layer and a gate electrode layer on the semiconductor substrate, and sequentially patterning the gate electrode layer, the insulating layer, the passivation layer, the charge trap layer, and the tunneling layer to form a tunneling layer pattern, a charge trap layer pattern and a shielding layer pattern, respectively, which are sequentially stacked on the pair of first sub channel regions, the shielding layer pattern being composed of the insulating layer and the passivation layer, and forming a gate insulating layer on the second channel region while forming a gate electrode covering the shielding layer pattern and the gate insulating layer.

The method may further include performing a fourth ion implantation using the gate electrode as a mask to form a source region and a drain region in the cell active region adjacent to the pair of first sub channel regions.

At least one of the above and other features and advantages of the present invention may be realized by providing a method of fabricating a non-volatile flash memory device including defining a cell region and a peripheral circuit region in a semiconductor substrate, forming a cell active region and a peripheral circuit active region in the cell region and the peripheral circuit region, respectively, performing a first ion implantation into the cell active region to form a first channel region, performing a second ion implantation into the peripheral circuit active region to form a peripheral circuit channel region, sequentially stacking a tunneling layer, a charge trap layer and a passivation layer on the semiconductor substrate, forming a first photoresist pattern covering a portion of the passivation layer on the cell active region and the peripheral circuit region, performing a third ion implantation using the first photoresist pattern as a mask to form a second channel region in the cell active region, removing the first photoresist pattern, forming a second photoresist pattern covering a top surface of the first channel region on the semiconductor substrate having the passivation layer, sequentially patterning the passivation layer, the charge trap layer, and the tunneling layer using the second photoresist pattern as a mask, and removing the second photoresist pattern.

Forming the first photoresist pattern may include forming an opening that crosses over a center of the cell active region and covers the entire peripheral circuit active region, wherein the first channel region is divided into a pair of first sub channel regions by the second channel regions.

The first photoresist pattern may be formed to cover one end of the cell active region and cover the entire peripheral circuit active region, and the first and second channel regions are formed to be adjacent to each other in the cell active region.

The method may further include, after removing the second photoresist pattern, sequentially forming an insulating layer and a gate electrode layer on the semiconductor substrate, and sequentially patterning the gate electrode layer, the insulating layer, the passivation layer, the charge trap layer, and the tunneling layer to form a tunneling layer pattern, a charge trap layer pattern and a shielding layer pattern, respectively, which are sequentially stacked on the pair of first sub channel regions, the shielding layer pattern being composed of the insulating layer and the passivation layer, and forming a gate insulating layer on the second channel region while forming a gate electrode covering the shielding layer pattern and the gate insulating layer.

The method may further include performing a fourth ion implantation using the gate electrode as a mask to form a source region and a drain region in the cell active region adjacent to the pair of first sub channel regions, respectively.

In either of these methods, forming the second channel region may include forming the second channel region to have an impurity concentration less than that of the first channel region.

In either of these methods, performing the third ion implantation may include using an impurity conductivity type opposite to that used in the first ion implantation.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
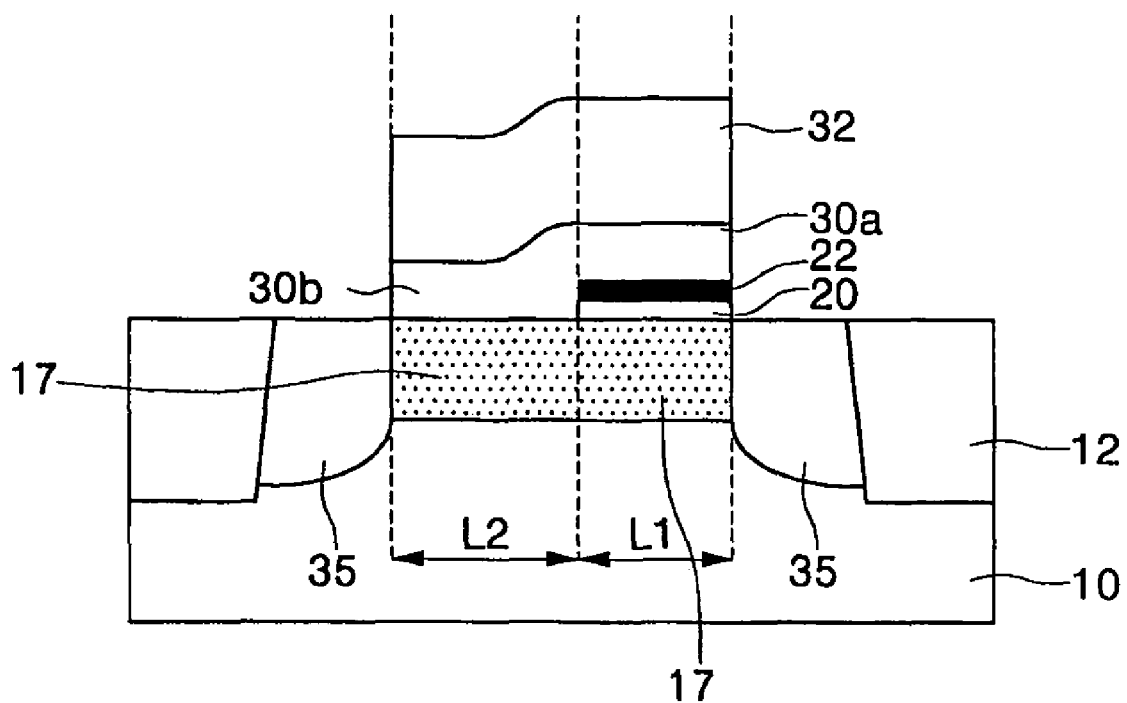
FIG. 1A illustrates a cross-sectional view of a conventional non-volatile flash memory device.

Korean Patent Application No. 2004-45142, filed on Jun. 17, 2004, in the Korean Intellectual Property Office, and entitled: "Non-Volatile Flash Memory Device Having At Least Two Different Channel Concentrations and Methods of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" or "below" another layer, it can be directly under or below, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 2A through 2E illustrate cross-sectional views of stages in a method of fabricating a non-volatile flash memory device according to a first embodiment of the present invention.

Figure 2A:
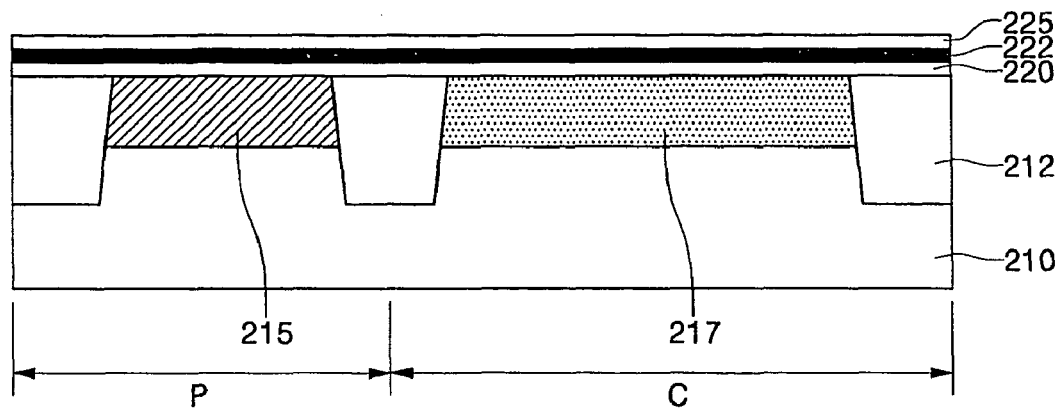
FIGS. 2A through 2E illustrate cross-sectional views of stages in a method of fabricating a non-volatile flash memory device according to a first embodiment of the present invention.

Referring to FIG. 2A, a cell region C and a peripheral circuit region P are defined in a semiconductor substrate 210. An isolation layer 212 is formed in the cell region C and the peripheral circuit region P. The isolation layer 212 may be formed by a trench isolation method. Impurity ions are implanted into an active region of the cell region C to form a first channel region 217. Impurity ions are then implanted into an active region of the peripheral circuit region P to form a preliminary peripheral circuit channel region 215. The preliminary peripheral circuit channel region 215 is formed with a different concentration from that which will be finally required of a peripheral circuit channel region. That is, a concentration of the preliminary peripheral circuit channel region 215 is determined in consideration of a concentration variation that will result from a subsequent ion implantation process.

A tunneling layer 220, a charge trap layer 222 and a passivation layer 225 are sequentially formed on the semiconductor substrate 210. The tunneling layer 220 may be formed of a silicon oxide layer or a silicon oxynitride (SiON) layer and may be formed by a thermal oxidation process. The charge trap layer 222 may be formed of a high-k dielectric layer. In particular, the charge trap layer 222 may be formed of a silicon nitride layer. The passivation layer 225, which may be formed of a silicon oxide layer or a silicon oxynitride layer, protects the charge trap layer 222 during a subsequent process. The charge trap layer 222 and the passivation layer 225 may be formed by a chemical vapor deposition (CVD) method or an atomic layer deposition (ALD) method.

Figure 2B:
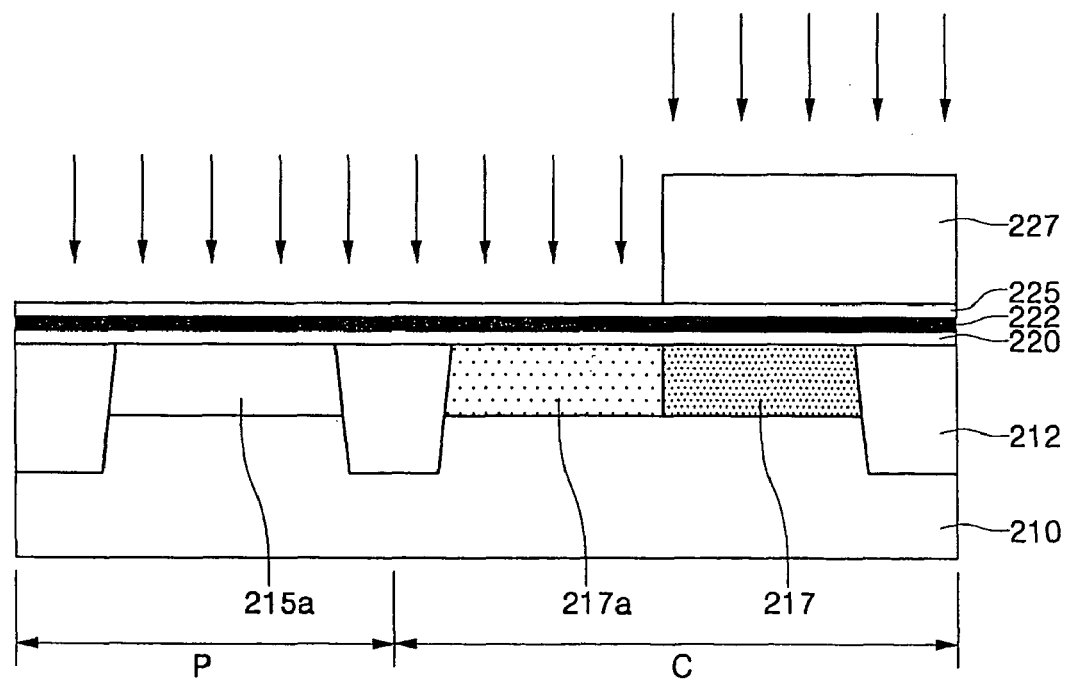

Referring to FIG. 2B, a photoresist layer is formed on the semiconductor substrate having the passivation layer 225. The photoresist layer is patterned to form a photoresist pattern 227 covering a portion of the passivation layer 225 on the first channel region 217. An ion implantation process is then performed using the photoresist pattern 227 as a mask. Impurities used for the ion implantation process preferably have a conductivity type opposite to that of the first channel region 217. As a result, a channel concentration of the preliminary peripheral circuit channel region 215 changes due to the ion implantation process. Thus, the preliminary peripheral circuit channel region 215 becomes a peripheral circuit channel region 215a. At the same time, a portion of the first channel region 217 exposed to the ion implantation process becomes a second channel region 217a, which has a channel concentration reduced by the implantation of the opposite conductivity type impurities.

Figure 2C:
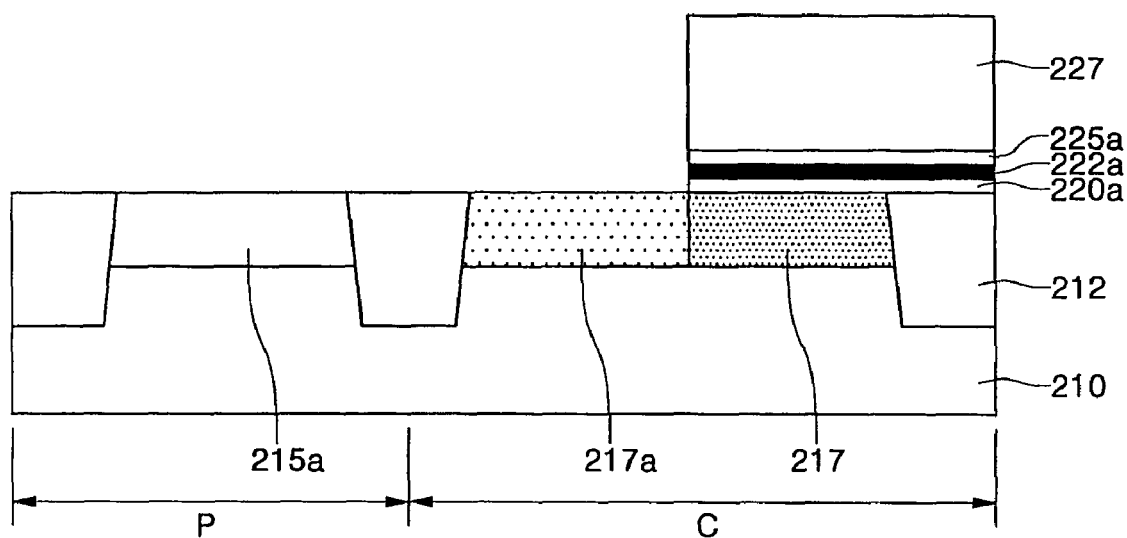

Referring to FIG. 2C, the passivation layer 225, the charge trap layer 222 and the tunneling layer 220 are sequentially patterned using the photoresist pattern 227 as a mask. As a result, a patterned passivation layer 225a, a patterned charge trap layer 222a, and a patterned tunneling layer 220a are formed and top surfaces of the peripheral circuit region P and the second channel region 217a are exposed.

Figure 2D:
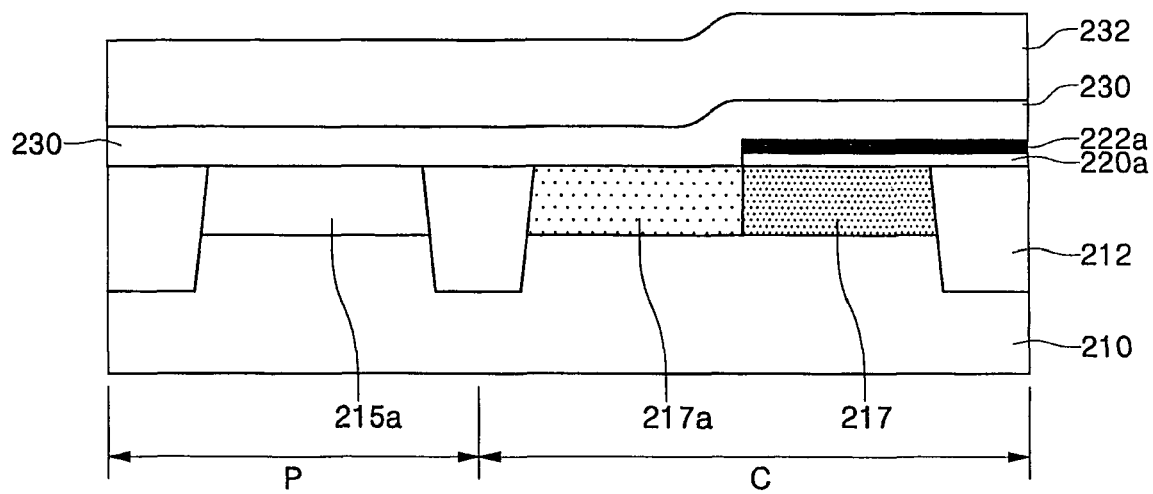

Referring to FIG. 2D, the photoresist pattern 227 is removed. Then, a cleaning process is performed for a subsequent deposition process. At this time, a part or an entirety of the patterned passivation layer 225a may be etched. Thereafter, an insulating layer 230 and a gate electrode layer 232 are sequentially formed on the semiconductor substrate 210. The insulating layer 230 may be formed of an oxide layer and may be formed by a CVD method. The gate electrode layer 232 may be formed of a polysilicon layer or a metal layer.

Figure 2E:
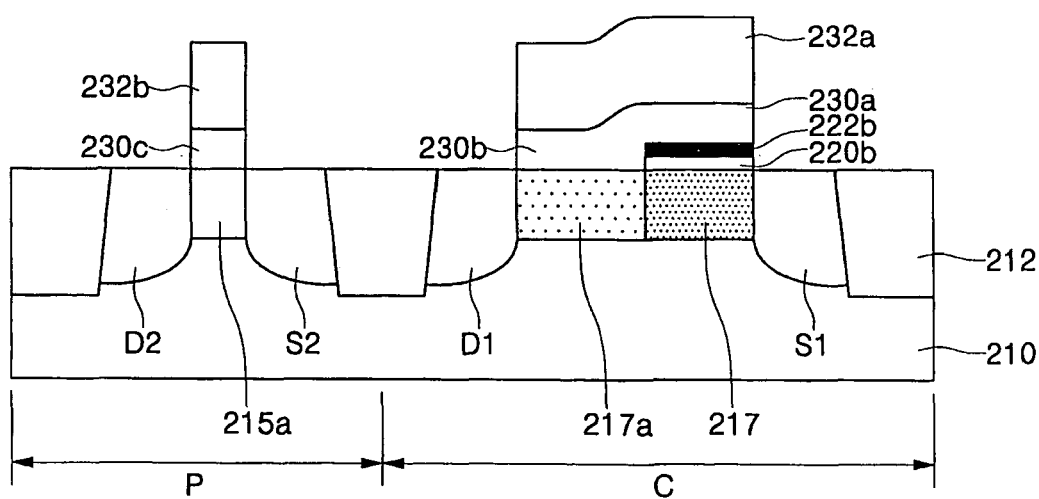

Referring to FIG. 2E, the gate electrode layer 232, the insulating layer 230, the patterned charge trap layer 222a, and the patterned tunneling layer 220a are sequentially patterned. As a result, a tunneling layer pattern 220b, a charge trap layer pattern 222b and a shielding layer pattern 230a, which are sequentially stacked, are formed on the first channel region 217. Here, the shielding layer pattern 230a is composed of the insulating layer 230. When a part of the patterned passivation layer 225a remains, the shielding layer pattern 230a is composed of the insulating layer 230 and the remaining patterned passivation layer 225a. At the same time, a gate insulating layer 230b is formed on the second channel region 217a, and a gate electrode 232a is formed to cover both the shielding layer 230a and the gate insulating layer 230b. The first channel region 217, the tunneling layer pattern 220b, the charge trap layer pattern 222b, the shielding layer pattern 230a, and the gate electrode 232a constitute a first gate region. The second channel region 217a, the gate insulating layer 230b and the gate electrode 232a constitute a second gate region.

Also at the same time, a peripheral circuit gate insulating layer 230c and a peripheral circuit gate electrode 232b, which are sequentially stacked on the peripheral circuit channel region 215a, are formed in the peripheral circuit region P. A thickness of the peripheral circuit gate insulating layer 230c depends on additional photolithography/etching/oxidation processes to be suitable for an operating voltage of peripheral circuits.

Thereafter, an ion implantation process is performed using the gate electrode 232a as a mask. As a result, a source region S1 and a drain region D1 may be formed in the cell active region adjacent to the tunneling layer pattern 220b and the gate insulating layer 230b, respectively. Also, an ion implantation process is performed using the peripheral circuit gate electrode 232b as a mask. As a result, a source region S2 and a drain region D2 are formed in the peripheral circuit active region adjacent to the peripheral circuit gate electrode 232b.

Figure 1B:
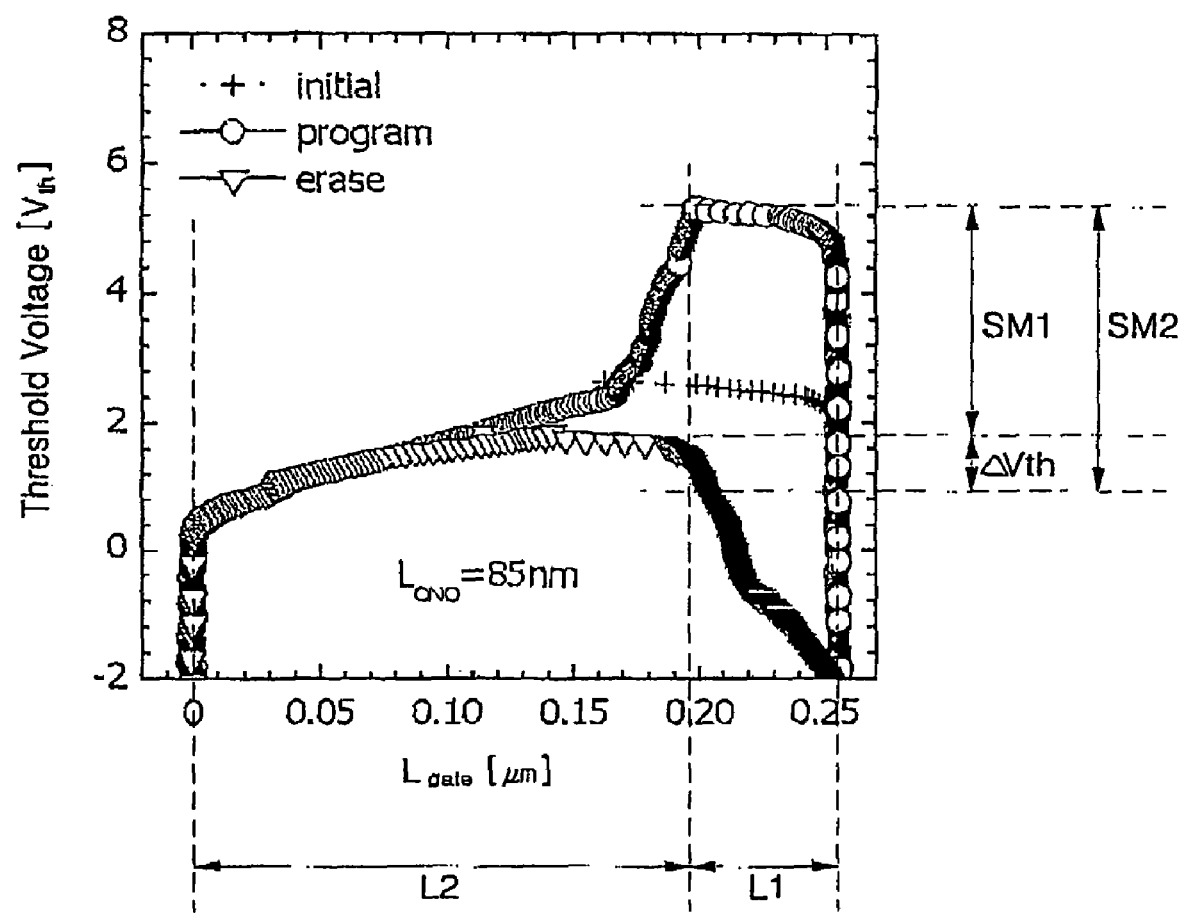
FIG. 1B is a graph showing a variation of threshold voltage depending on program and erase operations of the conventional non-volatile flash memory device shown in FIG. 1A.

The non-volatile flash memory device formed by the above described method includes two channel regions 217 and 217a, which have different impurity concentrations, formed between the source and drain regions S1 and D1. Thus, it is possible to independently vary a threshold voltage in the first gate region and the second gate region according to the concentrations of the two channel regions 217 and 217a. In particular, an amount of the on-cell current in the second gate region may be increased by making an impurity concentration of the second channel region 217a less than that of the first channel region 217. Thus, a threshold voltage in the second gate region is reduced. As a result, as described in FIG. 1B, a sensing margin of "on" or "off" operations of the non-volatile flash memory device may be increased by increasing a variation SM2 of a threshold voltage during program and erase operations of the non-volatile flash memory device.

Figure 3A:
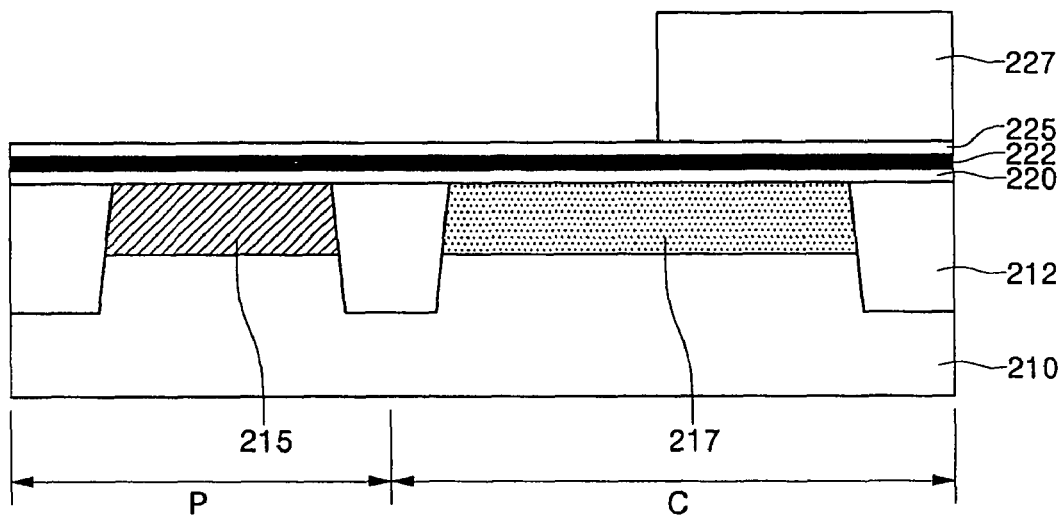
FIGS. 3A and 3B illustrate cross-sectional views of stages in a method of fabricating a non-volatile flash memory device according to a second embodiment of the present invention.
Figure 3B:
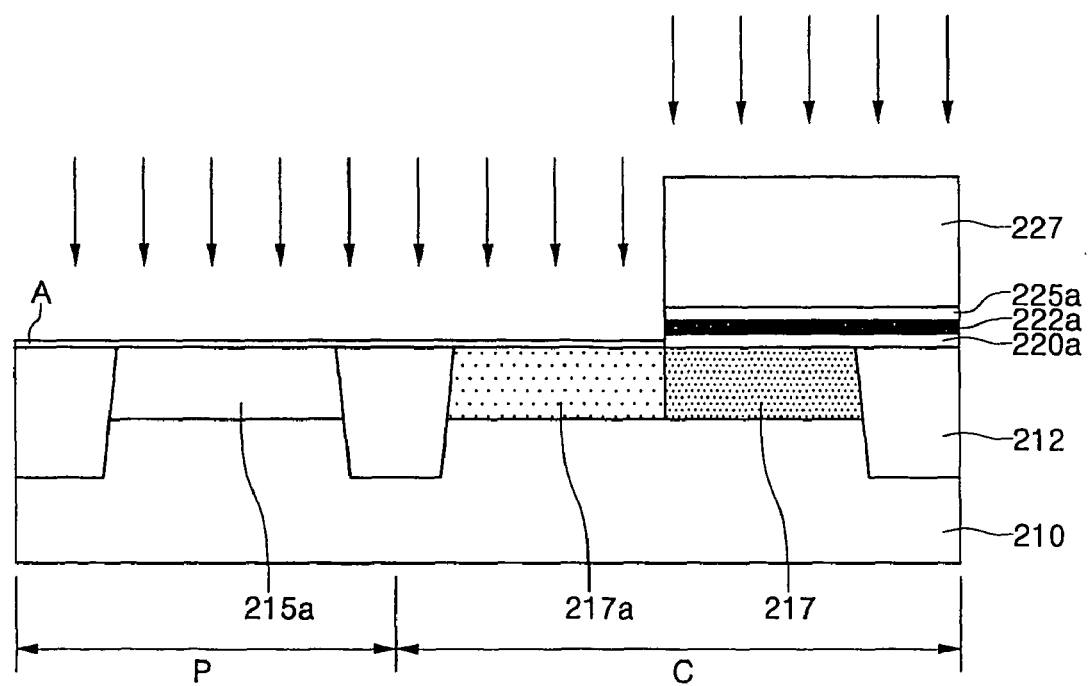

FIGS. 3A and 3B illustrate cross-sectional views of stages in a method of fabricating a non-volatile flash memory device according to a second embodiment of the present invention.

Referring to FIG. 3A, as described in connection with FIG. 2A, the cell region C and the peripheral circuit region P are defined in the semiconductor substrate 210. The isolation layer 212 is formed in the cell region C and the peripheral circuit region P. The first channel region 217 and the preliminary peripheral circuit channel region 215 are formed in the semiconductor substrate 210. The tunneling layer 220, the charge trap layer 222, and the passivation layer 225 are sequentially formed on the semiconductor substrate 210. Then, a photoresist layer is formed on the semiconductor substrate having the passivation layer 225. The photoresist layer is patterned to form the photoresist pattern 227 covering a portion of the passivation layer 225 on the first channel region 217.

Referring to FIG. 3B, the passivation layer 225, the charge trap layer 222 and the tunneling layer 220 are sequentially patterned using the photoresist pattern 227 as a mask. As a result, the patterned passivation layer 225a, the patterned charge trap layer 222a and the patterned tunneling layer 220a are formed, and the peripheral circuit region P and a portion of the top surface of the first channel region 217 are exposed. Here, a portion of the tunneling layer 220 that is not etched may be used as a buffer layer A.

Subsequently, an ion implantation process is performed using the photoresist pattern 227 as a mask. Here, an impurity conductivity type is preferably opposite to an impurity conductivity type of the first channel region 217. As a result, the preliminary peripheral circuit channel region 215 has a channel concentration varied by the ion implantation and thus becomes the peripheral circuit channel region 215a, and a portion of the first channel region 217 that is exposed to the ion implantation becomes the second channel region 217a, which has a channel concentration reduced by the implantation of the opposite conductivity type impurities.

Subsequent processes are substantially similar to those described in connection with FIGS. 2D and 2E and will not be repeated. The buffer layer A is removed during the cleaning process of FIG. 2D.

FIGS. 4A through 4E illustrate cross-sectional views of stages in a method of fabricating a non-volatile flash memory device according to a third embodiment of the present invention.

Figure 4A:
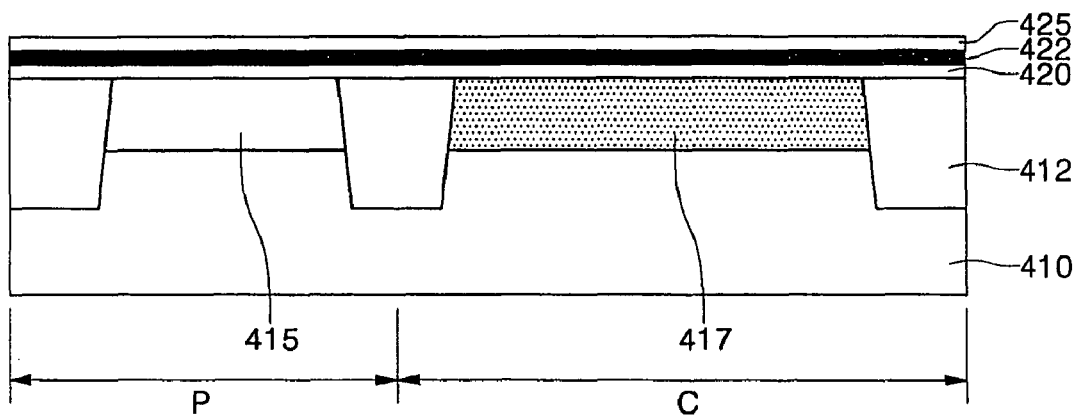
FIGS. 4A through 4E illustrate cross-sectional views of stages in a method of fabricating a non-volatile flash memory device according to a third embodiment of the present invention.

Referring to FIG. 4A, a cell region C and a peripheral circuit region P are defined in a semiconductor substrate 410. An isolation layer 412 is formed in the cell region C and the peripheral circuit region P. The isolation layer 412 may be formed by a trench isolation method. Impurity ions are implanted into an active region of the cell region C to form a first channel region 417. Impurity ions are then implanted into an active region of the peripheral circuit region P to form a peripheral circuit channel region 415.

A tunneling layer 420, a charge trap layer 422 and a passivation layer 425 are sequentially formed on the semiconductor substrate 410. The tunneling layer 420 may be formed of a silicon oxide layer or a silicon oxynitride (SiON) layer and may be formed by a thermal oxidation process. The charge trap layer 422 may be formed of a high-k dielectric layer. In particular, the charge trap layer 422 may be formed of a silicon nitride layer. The passivation layer 425, which may be formed of a silicon oxide layer or a silicon oxynitride layer, protects the charge trap layer 422 during a subsequent process. The charge trap layer 422 and the passivation layer 425 may be formed by a CVD method or an ALD method.

Figure 4B:
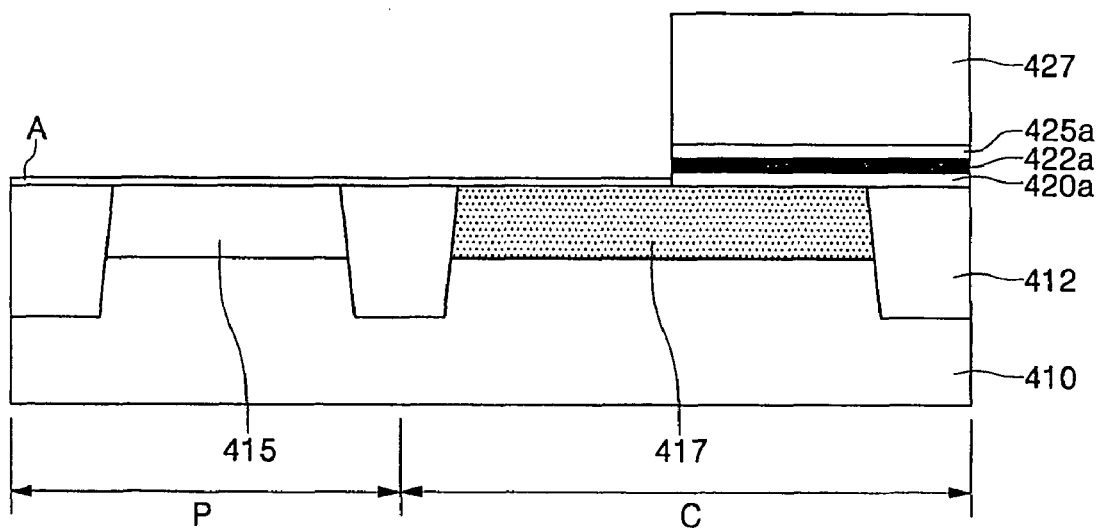

Referring to FIG. 4B, a first photoresist layer is formed on the semiconductor substrate having the passivation layer 425. The first photoresist layer is patterned to form a first photoresist pattern 427 covering a portion of the passivation layer 425 on the first channel region 417.

The passivation layer 425, the charge trap layer 422 and the tunneling layer 420 are sequentially patterned using the first photoresist pattern 427 as a mask. As a result, a patterned passivation layer 425a, a patterned charge trap layer 422a, and a patterned tunneling layer 420a are formed, and the peripheral circuit region P and a portion of the top surface of the first channel region 417 are exposed. If, however, a portion of the tunneling layer 420 is not etched, the top surface of the first channel region 417 is not exposed. Rather, the tunneling layer 420 is exposed and may be used as the buffer layer A.

Figure 4C:
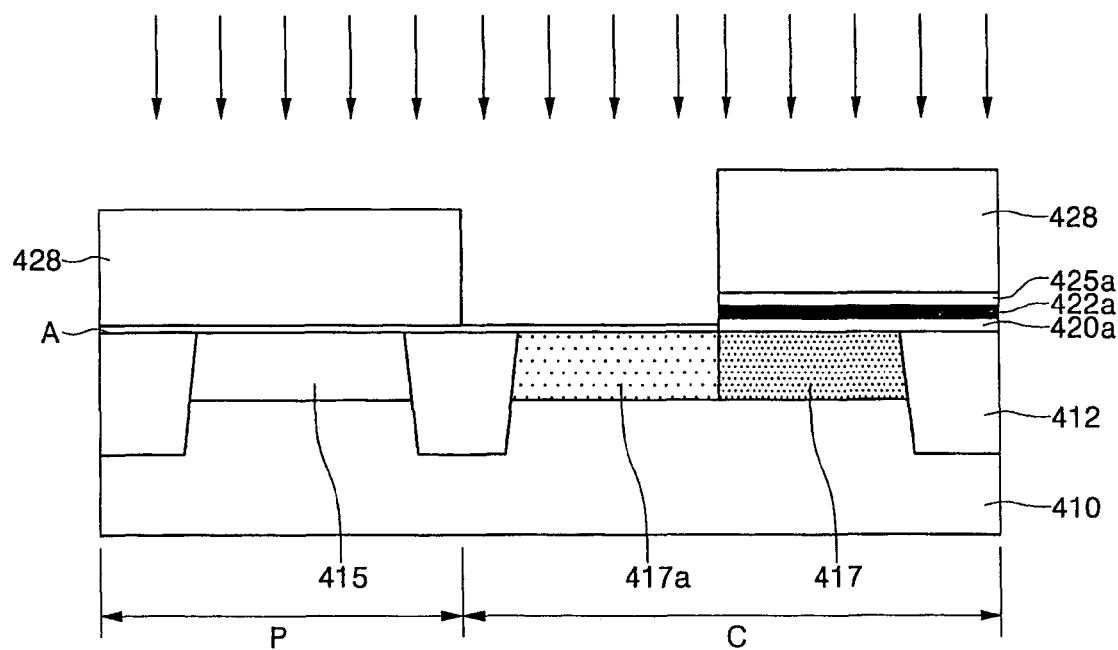

Referring to FIG. 4C, the first photoresist pattern 427 is removed and a second photoresist layer is formed over the semiconductor substrate 410. The second photoresist layer is patterned to form a second photoresist pattern 428 covering the peripheral circuit region P and the patterned passivation layer 425a. An ion implantation process is then performed using the second photoresist pattern 428 as a mask. Impurities used for the ion implantation process preferably have a conductivity type opposite to that of the first channel region 417. As a result, a portion of the first channel region 417, which is exposed to the ion implantation, becomes a second channel region 417a, which has a channel concentration reduced by the implantation of the opposite conductivity type impurities. The buffer layer A prevents the semiconductor substrate 410 from being damaged during the ion implantation process.

Figure 4D:
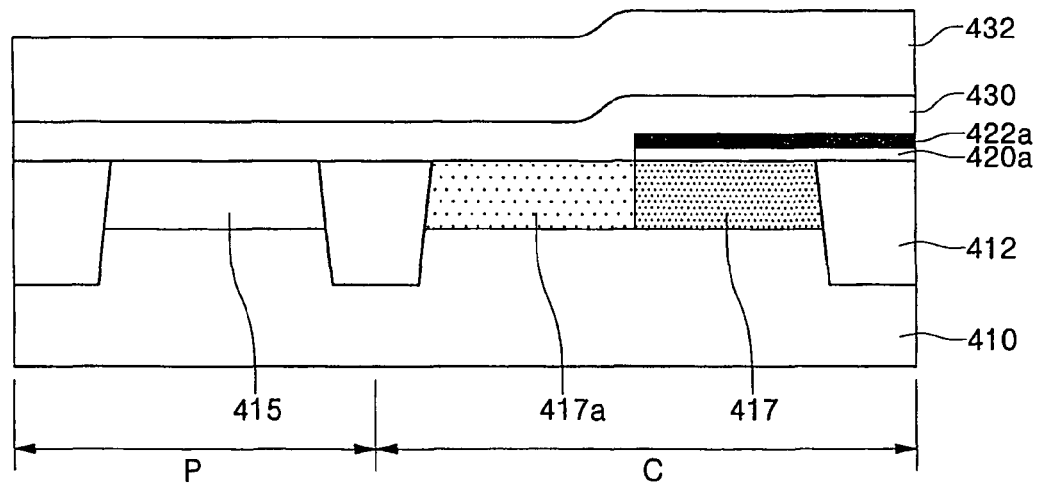

Referring to FIG. 4D, the second photoresist pattern 428 is removed. Then, a cleaning process is performed for a subsequent deposition process. At this time, the buffer layer A is completely removed, and a part or an entirety of the patterned passivation layer 425a may be etched. Thereafter, an insulating layer 430 and a gate electrode layer 432 are sequentially formed on the semiconductor substrate 410. The insulating layer 430 may be formed of an oxide layer and may be formed by a CVD method. The gate electrode layer 432 may be formed of a polysilicon layer or a metal layer.

Figure 4E:
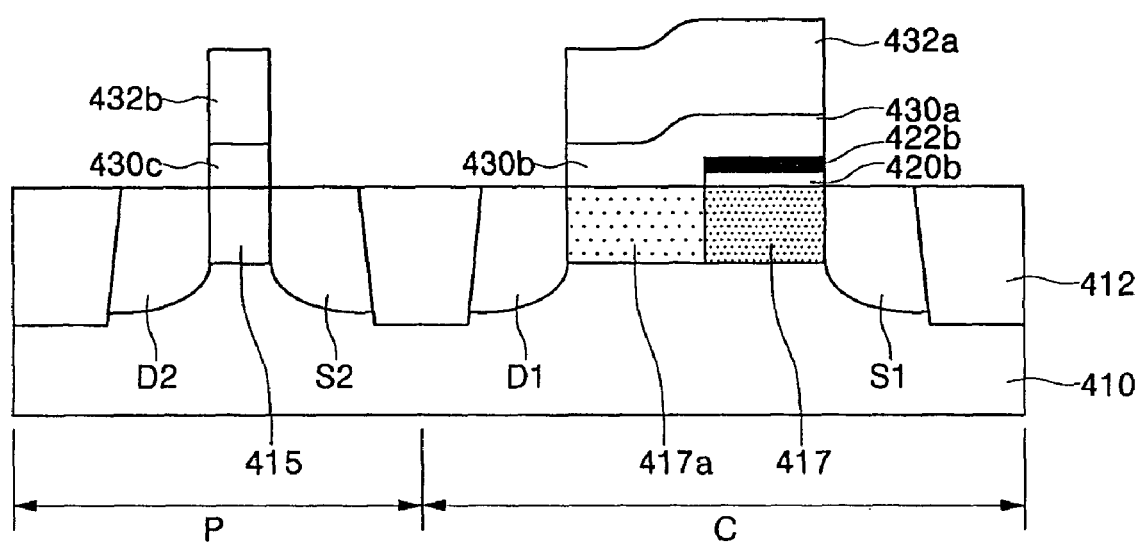

Referring to FIG. 4E, the gate electrode layer 432, the insulating layer 430, the patterned charge trap layer 422a, and the patterned tunneling layer 420a are sequentially patterned. As a result, a tunneling layer pattern 420b, a charge trap layer pattern 422b and a shielding layer pattern 430a, which are sequentially stacked, are formed on the first channel region 417. Here, the shielding layer pattern 430a is composed of the insulating layer 430. When a part of the patterned passivation layer 425a remains, the shielding layer pattern 430a is composed of the insulating layer 430 and the remaining patterned passivation layer 425a. At the same time, a gate insulating layer 430b is formed on the second channel region 417a, and a gate electrode 432a is formed to cover both the shielding layer 430a and the gate insulating layer 430b.

Also at the same time, a peripheral circuit gate insulating layer 430c and a peripheral circuit gate electrode 432b, which are sequentially stacked over the peripheral circuit channel region 415, are formed in the peripheral circuit region P. A thickness of the peripheral circuit gate insulating layer 430c depends on additional photolithography/etching/oxidation processes to be suitable for an operating voltage of peripheral circuits.

Thereafter, an ion implantation process is performed using the gate electrode 432a as a mask. As a result, a source region S1 and a drain region D1 may be formed in the cell active region adjacent to the tunneling layer pattern 420b and the gate insulating layer 430b, respectively. Also, an ion implantation process is performed using the peripheral circuit gate electrode 432b as a mask. As a result, a source region S2 and a drain region D2 are formed in the peripheral circuit active region adjacent to the peripheral circuit gate electrode 432b.

Figure 5A:
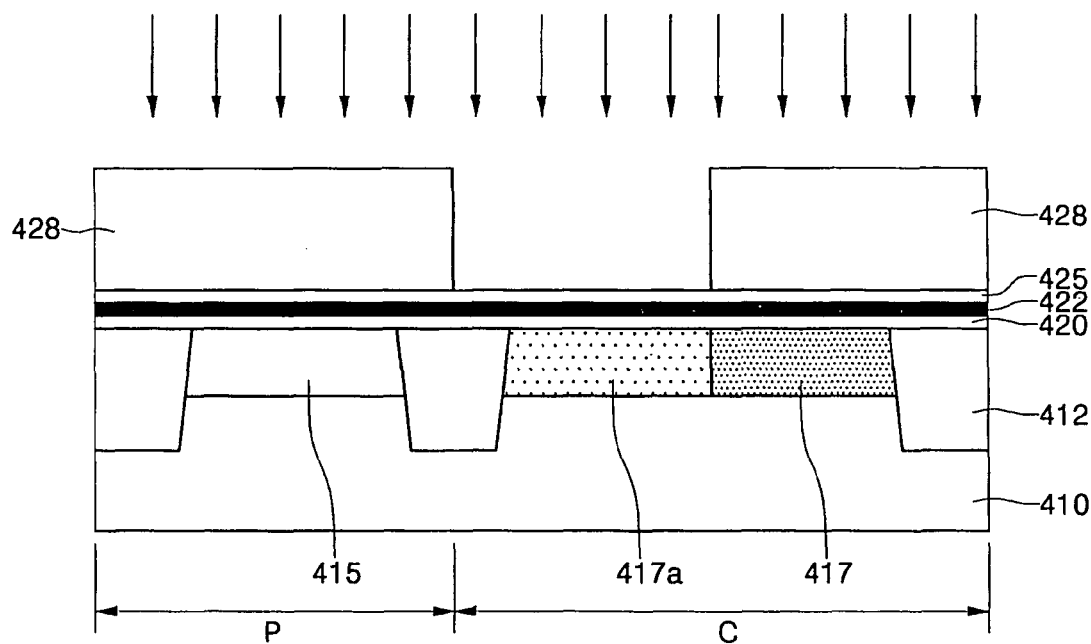
FIGS. 5A and 5B illustrate cross-sectional views of stages in a method of fabricating a non-volatile flash memory device according to a fourth embodiment of the present invention.
Figure 5B:
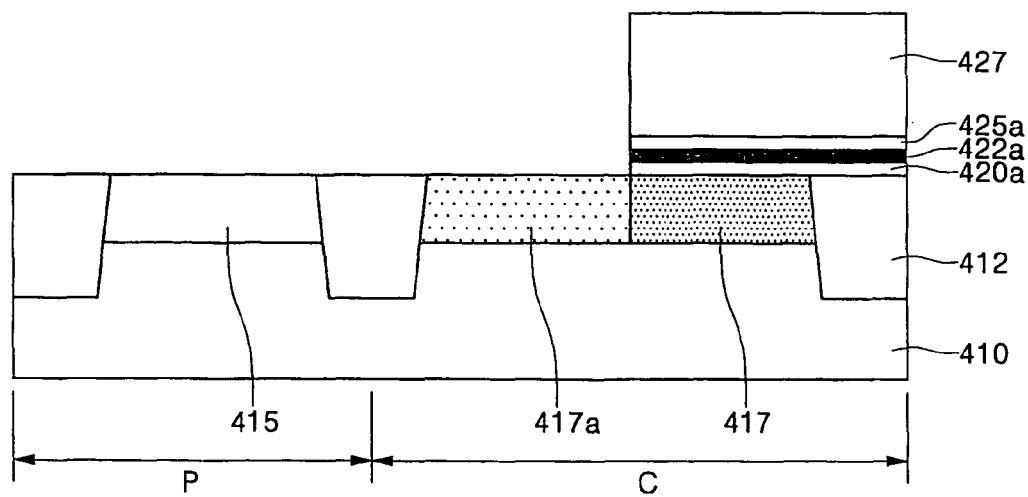

FIGS. 5A and 5B illustrate cross-sectional views of stages in a method of fabricating a non-volatile flash memory device according to a fourth embodiment of the present invention.

Referring to FIG. 5A, as described in connection with FIG. 4A, the cell region C and the peripheral circuit region P are defined in a semiconductor substrate 410. The isolation layer 412 is formed in the cell region C and the peripheral circuit region P. The first channel region 417 and the peripheral circuit channel region 415 are formed in the semiconductor substrate 410. The tunneling layer 420, the charge trap layer 422, and the passivation layer 425 are sequentially formed on the semiconductor substrate 410. Then, a second photoresist layer is formed on the semiconductor substrate having the passivation layer 425. The second photoresist layer is patterned to form the second photoresist pattern 428 exposing a portion of the passivation layer 425 on the first channel region 417.

An ion implantation process is performed using the second photoresist pattern 428 as a mask. Impurities used for the ion implantation process preferably have a conductivity type opposite to that of the first channel region 417. As a result, a portion of the first channel region 417, which is exposed to the ion implantation, becomes the second channel region 417a, which has a channel concentration reduced by the implantation of the opposite conductivity type impurities.

Referring to FIG. 5B, the second photoresist pattern 428 is removed. Then, a first photoresist layer is formed on the semiconductor substrate having the passivation layer 425. The first photoresist layer is patterned to form the first photoresist pattern 427 covering the passivation layer 425 on the first channel region 417.

The passivation layer 425, the charge trap layer 422 and the tunneling layer 420 are sequentially patterned using the first photoresist pattern 427 as a mask. As a result, a patterned passivation layer 425a, a patterned charge trap layer 422a and a patterned tunneling layer 420a are formed, and top surfaces of the peripheral circuit region P and the second channel region 417a are exposed.

Thereafter, the first photoresist pattern 427 is removed. Subsequent processes are substantially similar to those described in connection with FIGS. 4D and 4E and will not be repeated.

FIGS. 6A through 6E illustrate cross-sectional views of stages in a method of fabricating a non-volatile flash memory device according to a fifth embodiment of the present invention.

Figure 6A:
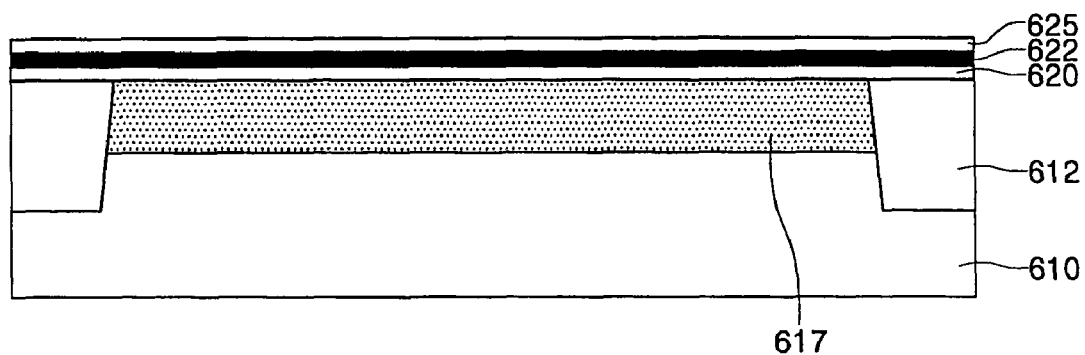
FIGS. 6A through 6E illustrate cross-sectional views of stages in a method of fabricating a non-volatile flash memory device according to a fifth embodiment of the present invention.

Referring to FIG. 6A, an isolation layer 612 is formed in a semiconductor substrate 610 to define an active region. The isolation layer 612 may be formed by a trench isolation method. Impurity ions are implanted into the active region to form a first channel region 617.

A tunneling layer 620, a charge trap layer 622 and a passivation layer 625 are sequentially formed on the semiconductor substrate 610. The tunneling layer 620 may be formed of a silicon oxide layer or a silicon oxynitride (SiON) layer and may be formed by a thermal oxidation process. The charge trap layer 622 may be formed of a high-k dielectric layer. In particular, the charge trap layer 622 may be formed of a silicon nitride layer. The passivation layer 625, which may be formed of a silicon oxide layer or a silicon oxynitride layer, protects the charge trap layer 622 during a subsequent process. The charge trap layer 622 and the passivation layer 625 may be formed by a CVD method or an ALD method.

Figure 6B:
Figure 6B:
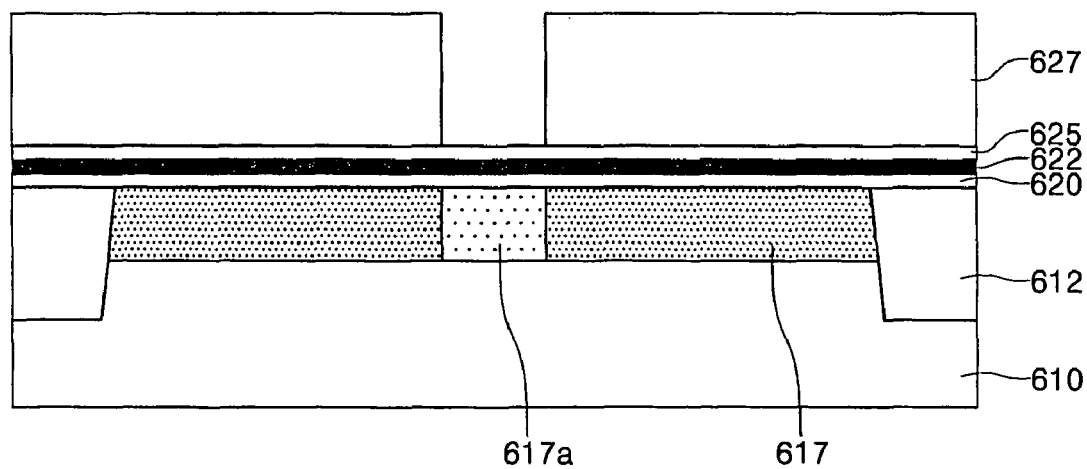

Referring to FIG. 6B, a photoresist layer is formed on the semiconductor substrate having the passivation layer 625. The photoresist layer is patterned to form a photoresist pattern 627 exposing a portion of the passivation layer 625 on the first channel region 617. An ion implantation process is then performed using the photoresist pattern 627 as a mask. Impurities used for the ion implantation preferably have a conductivity type opposite to that of the first channel region 617. As a result, a portion of the first channel region 617 which is exposed to the ion implantation becomes a second channel region 617a, which has a channel concentration reduced by the implantation of the opposite conductivity type impurities. As a result, a pair of first channel regions 617, e.g., first sub channel regions, are formed to be separated by the second channel region 617a.

Figure 6C:
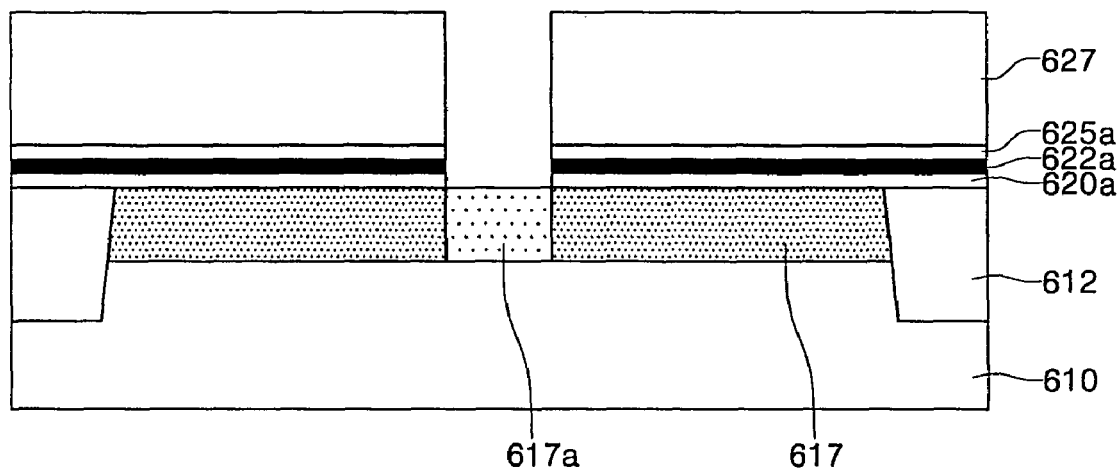

Referring to FIG. 6C, the passivation layer 625, the charge trap layer 622 and the tunneling layer 620 are sequentially patterned using the photoresist pattern 627 as a mask. As a result, a patterned passivation layer 625a, a patterned charge trap layer 622a, and a patterned tunneling layer 620a are formed, and a top surface of the second channel region 617a is exposed.

Figure 6D:
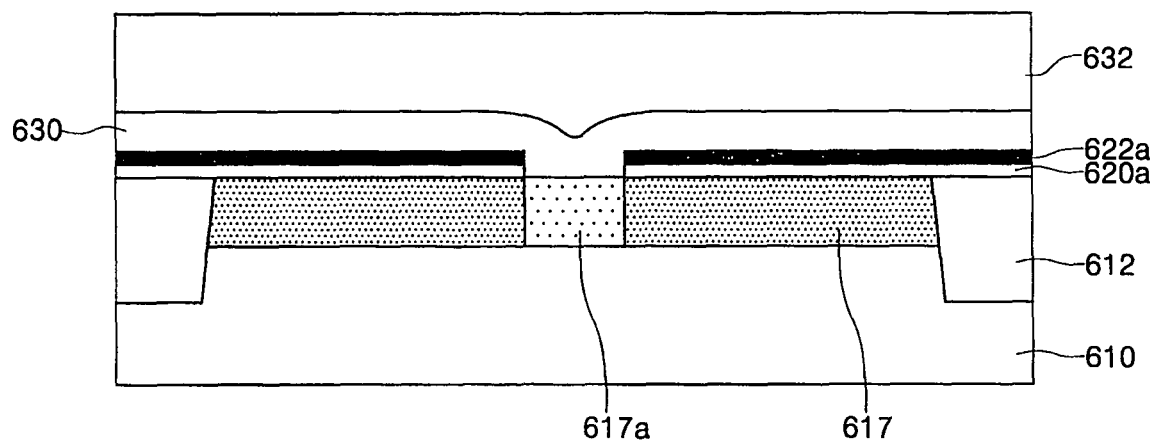

Referring to FIG. 6D, the photoresist pattern 627 is removed. Then, a cleaning process is performed for a subsequent deposition process. At this time, a part or an entirety of the patterned passivation layer 625a may be etched. Thereafter, an insulating layer 630 and a gate electrode layer 632 are sequentially formed over the semiconductor substrate 610. The insulating layer 630 may be formed of an oxide layer and may be formed by a CVD method. The gate electrode layer 632 may be formed of a polysilicon layer or a metal layer.

Figure 6E:
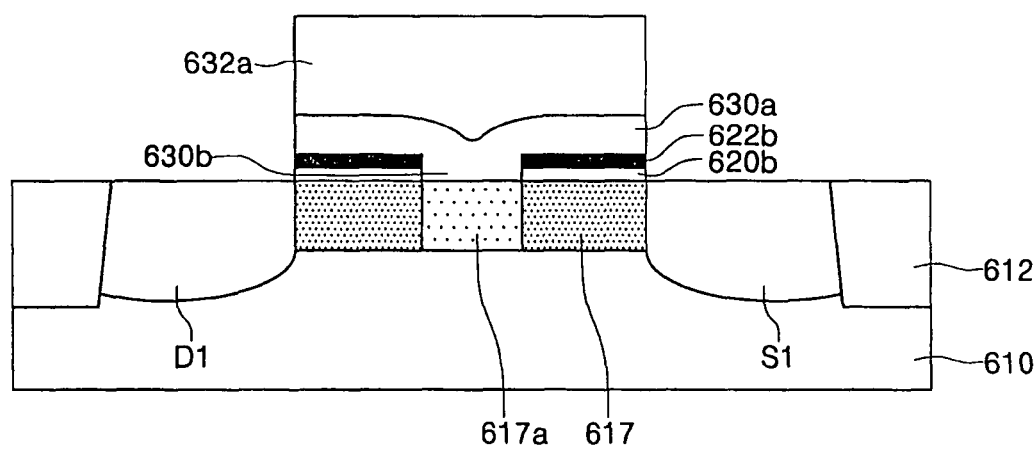

Referring to FIG. 6E, the gate electrode layer 632, the insulating layer 630, the patterned charge trap layer 622a, and the patterned tunneling layer 620a are sequentially patterned. As a result, tunneling layer patterns 620b, charge trap layer patterns 622b and shielding layer patterns 630a, which are sequentially stacked, are formed on each of the first channel regions 617. Here, the shielding layer patterns 630a are composed of the insulating layer 630. When a part of the patterned passivation layer 625a remains, the shielding layer patterns 630a are composed of the insulating layer 630 and the remaining patterned passivation layer 625a. At the same time, a gate insulating layer 630b is formed on the second channel region 617a, and a gate electrode 632a is formed to cover both the shielding layer 630a and the gate insulating layer 630b.

Thereafter, an ion implantation process is performed using the gate electrode 632a as a mask. As a result, a source region S1 and a drain region D1 may be formed in the cell active region adjacent to the tunneling layer patterns 620b.

The resultant non-volatile flash memory device according to the fifth embodiment of the present invention will now be further described with reference to FIG. 6E.

Referring to FIG. 6E, the source region S1 and the drain region D1 are disposed to be spaced apart from each other in the semiconductor substrate 610. Tunneling layer patterns 620b, charge trap layer patterns 622b and shielding layer patterns 630a, which are adjacent to, but spaced apart from, the source region S1 and the drain region D1, are disposed on the semiconductor substrate 610 between the source region S1 and the drain region D1. The tunneling layer patterns 620b may be a silicon oxide layer or a silicon oxynitride layer. The charge trap layer patterns 622b may be a high-k dielectric layer. In particular, the charge trap layer patterns 622b may be a silicon nitride layer.

First channel regions 617, i.e., the first sub channel regions, are disposed in the semiconductor substrate below the tunneling layer patterns 620b. The gate insulating layer 630b is disposed on the semiconductor substrate between the first channel regions 617. The shielding layer patterns 630a and the gate insulating layer 630b are formed of the same material layer and are connected. The shielding layer patterns 630a and the gate insulating layer 630b may be an oxide layer and may have the same thickness.

The second channel region 617a is disposed in the semiconductor substrate below the gate insulating layer 630b. It is preferable that an impurity concentration of the second channel region 617a is less than that of the first channel region 617. The gate electrode 632a covers both the shielding layer patterns 630a and the gate insulating layer 630b. The gate electrode 632a may be a polysilicon layer or a metal layer.

Figure 7:
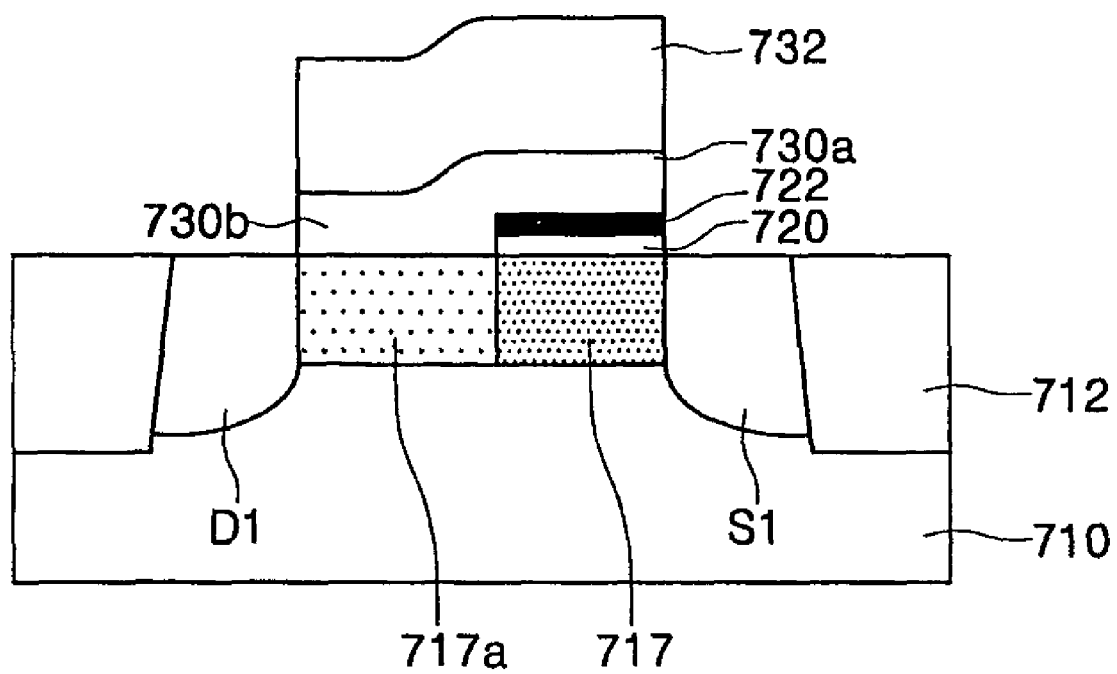
FIG. 7 illustrates a cross-sectional view of a resultant non-volatile flash memory device according to an embodiment of the present invention.

FIG. 7 illustrates a cross-sectional view of a resultant non-volatile flash memory device according to an embodiment of the present invention.

Referring to FIG. 7, a source region S1 and a drain region D1 are disposed to be spaced apart from each other in a semiconductor substrate 710 including an isolation region 712. A tunneling layer pattern 720, a charge trap layer pattern 722 and a shielding layer pattern 730a, which are sequentially stacked to be adjacent to the source region S1, are disposed on the semiconductor substrate between the source region S1 and the drain region D1. The tunneling layer pattern 720 may be a silicon oxide layer or a silicon oxynitride layer. The charge trap layer pattern 722 may be a high-k dielectric layer. In particular, the charge trap layer pattern 722 may be a silicon nitride layer.

A first channel region 717 is disposed in the semiconductor substrate 710 below the tunneling layer pattern 720. A gate insulating layer 730b is disposed on the semiconductor substrate 710 between the drain region D1 and the first channel region 717. The shielding layer pattern 730a and the gate insulating layer 730b are formed of the same material layer and are connected. The shielding layer pattern 730a and the gate insulating layer 730b may be an oxide layer and may have the same thickness.

A second channel region 717a is disposed in the semiconductor substrate 710 below the gate insulating layer 730b. It is preferable that an impurity concentration of the second channel region 717a is less than that of the first channel region 717. A gate electrode 732 covers both the shielding layer pattern 730a and the gate insulating layer 730b. The gate electrode 732 may be a polysilicon layer or a metal layer.

As described above, by forming a channel region below the tunneling layer to have a different channel concentration from a channel region below the gate insulating layer, a variation of a threshold voltage during program and erase operations may be increased, and thus a sensing margin of the non-volatile flash memory device may be increased. In particular, by forming a channel region below the gate insulating layer to have a concentration less than a channel region below the tunneling layer, a threshold voltage during an erase operation may be significantly reduced, thereby significantly improving a sensing margin. As a result, a non-volatile flash memory device having excellent characteristics may be achieved.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a non-volatile flash memory device, comprising:
  defining a cell region and a peripheral circuit region in a semiconductor substrate;
  forming a cell active region and a peripheral circuit active region in the cell region and the peripheral circuit region, respectively;
  performing a first ion implantation into the cell active region to form a first channel region;
  performing a second ion implantation into the peripheral circuit active region to form a peripheral circuit channel region;
  sequentially stacking a tunneling layer, a charge trap layer and a passivation layer on the semiconductor substrate;
  forming a first photoresist pattern on the semiconductor substrate having the passivation layer, the first photoresist pattern covering a portion of the passivation layer on the first channel region;
  sequentially patterning the passivation layer, the charge trap layer and the tunneling layer using the first photoresist pattern as a mask;
  removing the first photoresist pattern;
  forming a second photoresist pattern covering the passivation layer and the peripheral circuit region;
  performing a third ion implantation using the second photoresist pattern as a mask to form a second channel region in the cell active region; and
  removing the second photoresist pattern.

2. The method as claimed in claim 1, wherein the first photoresist pattern is formed to cover one end of the cell active region and expose the peripheral circuit active region, and the first and second channel regions are formed to be adjacent to each other in the cell active region.

3. The method as claimed in claim 2, further comprising:
  after removing the second photoresist pattern,
  sequentially forming an insulating layer and a gate electrode layer on the semiconductor substrate; and
  sequentially patterning the gate electrode layer, the insulating layer, the passivation layer, the charge trap layer, and the tunneling layer to form a tunneling layer pattern, a charge trap layer pattern and a shielding layer pattern, respectively, which are sequentially stacked on the first channel region, the shielding layer pattern being composed of the insulating layer and the passivation layer, and forming a gate insulating layer on the second channel region while forming a gate electrode covering the shielding layer pattern and the gate insulating layer.

4. The method as claimed in claim 3, further comprising performing a fourth ion implantation using the gate electrode as a mask to form a source region and a drain region in the cell active region adjacent to the first channel region and the second channel region, respectively.

5. The method as claimed in claim 1, wherein forming the second channel region comprises forming the second channel region to have an impurity concentration less than that of the first channel region.

6. The method as claimed in claim 1, wherein performing the third ion implantation comprises using an impurity conductivity type opposite to that used in the first ion implantation.

7. The method as claimed in claim 1, wherein forming the first photoresist pattern comprises forming an opening that crosses over a center of the cell active region and exposes the peripheral circuit active region, wherein the first channel region is divided into a pair of first sub channel regions by the second channel region.

8. The method as claimed in claim 7, further comprising:

after removing the second photoresist pattern, sequentially forming an insulating layer and a gate electrode layer on the semiconductor substrate; and sequentially patterning the gate electrode layer, the insulating layer, the passivation layer, the charge trap layer, and the tunneling layer to form a tunneling layer pattern, a charge trap layer pattern and a shielding layer pattern, respectively, which are sequentially stacked on the pair of first sub channel regions, the shielding layer pattern being composed of the insulating layer and the passivation layer, and forming a gate insulating layer on the second channel region while forming a gate electrode covering the shielding layer pattern and the gate insulating layer.

9. The method as claimed in claim 8, further comprising performing a fourth ion implantation using the gate electrode as a mask to form a source region and a drain region in the cell active region adjacent to the pair of first sub channel regions.

* * * * *